United States Patent [19]

Hemphill

[11] Patent Number: 5,594,353
[45] Date of Patent: Jan. 14, 1997

[54] METHOD AND APPARATUS FOR MEASURING THE CHANGE IN CAPACITANCE VALUES IN DUAL CAPACITORS

[75] Inventor: Brian D. Hemphill, Sagamore Hills, Ohio

[73] Assignee: Elsag International N.V., Amsterdam, Netherlands

[21] Appl. No.: 439,305

[22] Filed: May 11, 1995

[51] Int. Cl.$^6$ ................................................. G01R 27/26
[52] U.S. Cl. .......................... 324/681; 324/658; 324/661
[58] Field of Search ................................ 324/658, 660, 324/661, 662, 674, 681

[56] References Cited

U.S. PATENT DOCUMENTS

| | | | |
|---|---|---|---|
| 4,093,915 | 6/1978 | Briefer | 324/658 X |
| 4,310,806 | 1/1982 | Ogasawara | 324/661 X |
| 5,197,429 | 3/1993 | Kita | 123/357 |
| 5,283,528 | 2/1994 | van Seeters | 324/679 |
| 5,323,118 | 6/1994 | Tonogai et al. | 324/661 |
| 5,497,101 | 3/1996 | Fillion | 324/662 |

Primary Examiner—Kenneth A. Wieder
Assistant Examiner—Glenn W. Brown
Attorney, Agent, or Firm—Paul R. Katterle

[57] ABSTRACT

A method and apparatus for calculating a ratio, R, having a first capacitance value, $C_1$, in inverse relation to a second capacitance value, $C_2$, where $C_1$ and $C_2$ are the capacitance values of a first capacitor and a second capacitor respectively. The first and second capacitors each have an independent electrode and share a common electrode. An AC voltage is applied to the common electrode producing first and second AC current signals at the two independent electrodes. A dual switched-capacitor integrated circuit and two current to frequency converters respectively convert the first and second AC current signals to first and second frequency signals having values $f_1$ and $f_2$. A microprocessor receives the first and second frequency signals and calculates R from $f_1$ and $f_2$.

14 Claims, 2 Drawing Sheets

METHOD AND APPARATUS FOR MEASURING THE CHANGE IN CAPACITANCE VALUES IN DUAL CAPACITORS

FIELD OF THE INVENTION

This invention relates to circuits for measuring the change in capacitance values of two capacitors and more particularly to circuits for measuring the change in capacitance values in dual capacitors.

DESCRIPTION OF THE PRIOR ART

As is well known in the prior art, dual capacitors are comprised of two individual capacitors sharing a common electrode. The two capacitors can both be fixed, one can be fixed and one can be variable, or both can be variable; the dual variable form being the most common. Specifically, dual inversely variable capacitors are the most common form of dual capacitors used in measurement applications. Dual inversely variable capacitors are comprised of two individual capacitors sharing a common electrode that are arranged such that the movement of an object in contact with, or proximate to, the two capacitors will increase the capacitance in one capacitor and decrease the capacitance in the other capacitor.

One of the forms dual inversely variable capacitors can take is the differential capacitor. The differential capacitor has a movable rotor interposed between a fixed common electrode and a first fixed independent electrode and second fixed independent electrode; the common electrode and first independent electrode forming a first capacitor and the common electrode and the second independent electrode forming a second capacitor. The rotation of the rotor increases the area of the first independent electrode adjacent to the common electrode and decreases (by the same amount) the area of the second independent electrode adjacent to the common electrode. Thus, as the rotor rotates, the capacitance of the first capacitor increases by a certain amount while the capacitance of the second capacitor decreases by the certain amount.

Another one of the forms dual inversely variable capacitors can take is disclosed in U.S. Pat. No. 5,283,528 (the "528 Patent") issued to van Seeters. In the 528 Patent, the dual inversely variable capacitors are comprised of a movable common electrode interposed between a first fixed independent electrode and a second fixed independent electrode; the common electrode and first independent electrode forming a first capacitor and the common electrode and the second independent electrode forming a second capacitor. As the common electrode moves towards the first independent electrode, the capacitance of the first capacitor decreases while the capacitance of the second capacitor increases. The amount of the decrease in capacitance of the first capacitor, however, is not equal to the amount of the increase in capacitance of the second capacitor.

Dual inversely variable capacitors are often used to measure the movement of a body relative to a fixed point or to another body because dual inversely variable capacitors do not contain any electrical contacts that can become fouled. The dual inversely variable capacitors are connected to a measuring circuit that uses the change in capacitances to calculate the movement of the body. In the prior art, capacitance bridge circuits and circuits containing subtractors and integrators are used as measuring circuits.

In U.S. Pat. No. 5,197,429 (the "429 Patent") to Kita, a measuring circuit utilizing a capacitance bridge configuration is disclosed. The measuring circuit is comprised of an AC source having a voltage $V_s$, a bridge circuit comprised of a fixed resistor R1 connected in series with a variable resistor R2 and series connected capacitors $C_1$ and $C_2$ connected in parallel to R1 and R2, a full wave rectifier and a DC amplifier. In the 429 Patent, the change in capacitances of $C_1$ and $C_2$ produces a change in the output voltage of the bridge circuit, $\underline{e}$, pursuant to a first equation:

$$e = K + \frac{C_1 - C_2}{C_1 + C_2} \cdot V_S$$

Since the term $C_1+C_2$ is a constant due to the nature of differential capacitors, the first equation can be reduced to a second equation:

$$e = K_1 \cdot (C_1 - C_2) \cdot V_s + K_2$$

Kita does not disclose how the first equation is derived, nor how the change in $\underline{e}$ is converted to a measure of the movement of the body.

In the 528 Patent, a measuring circuit utilizing integrators and subtractors is disclosed. The first embodiment of the measuring circuit is comprised of a square-wave generator, an integrator, parallel connected capacitors $C_1$ and $C_2$, two current amplifiers and an A/D converter. The square-wave generator generates a train of square-wave voltage pulses of period length T. The square-wave voltage pulses are converted in the integrator into a train of triangular-wave voltage pulses having a peak-to-peak value $U_{ss}$ and a period length T. The triangular-wave voltage pulses are supplied to the connected electrodes of $C_1$ and $C_2$. As is well known, a capacitor acts as a differentiating element for an applied voltage, $U_i$, in accordance with the relationship:

$$I = C \cdot \frac{dU_i}{dt}$$

Accordingly, the triangular-wave voltage pulses are differentiated in $C_1$ and $C_2$ yielding square-wave current pulse trains $I_1(t)$ and $I_2(t)$ respectively. $I_1(t)$ and $I_2(t)$ are converted to amplified square-wave voltage pulse trains $U_1(t)$ and $U_2(t)$ in the current amplifiers. The A/D converter receives $U_1(t)$ and $U_2(t)$. During a first signal period, the A/D converter means determines two digital amplitude values of $U_1(t)$ at an interval of half a signal period (T/2), said digital amplitude values being designated $U_{s1}$ and $U_{s2}$. During a second signal period, the A/D converter determines two digital amplitude values of $U_2(t)$ at an interval of half a signal period (T/2), said digital amplitude values being designated $U_{s3}$ and $U_{s4}$. Using the known relationship:

$$U_S = R \cdot C \cdot \frac{dU_i}{dt}$$

it follows that:

$$U_{s1} = R \cdot C_1 \cdot \frac{U_{ss}}{\frac{T}{2}}$$

$$U_{s2} = R \cdot C_1 \cdot \frac{(-U_{ss})}{\frac{T}{2}}$$

-continued $$U_{s3} = R \cdot C_2 \cdot \frac{U_{ss}}{\frac{T}{2}}$$

$$U_{s4} = R \cdot C_2 \cdot \frac{(-U_{ss})}{\frac{T}{2}}$$

Making the appropriate substitutions, the following relationship is obtained:

$$\frac{(U_{s1} - U_{s2})}{(U_{s3} - U_{s4})} = \frac{C_1}{C_2}$$

Using known electrostatic laws, van Seeters converts the values $(U_{s1}-U_{s2})$ and $(U_{s3}-U_{s4})$ into a measure of the movement of the body.

Van Seeters discloses a second embodiment of the 528 Patent measuring circuit wherein two A/D converters are used instead of the one A/D converter. One A/D converter is placed in one leg of the measuring circuit after one of the current amplifiers and the other A/D converter is placed in the other leg of the measuring circuit after the other current amplifier. The two A/D converters enable the measuring circuit to determine $U_{s1}$ and $U_{s2}$ parallel in time with $U_{s3}$ and $U_{s4}$, i.e., the two sets of digital amplitude values are determined in one signal period rather than in two signal periods.

The 429 Patent measuring circuit is susceptible to mutual drifts in the capacitors caused by temperature and other environmental factors because the measuring circuit assumes that the sum of the capacitances, $(C_1+C_2)$, is a constant. In addition, the 429 Patent measuring circuit is susceptible to drifts in the voltage, $V_s$, of the AC source because the output, e, is a function of $V_s$ as shown earlier.

The 528 Patent measuring circuit is not susceptible to mutual drifts in the capacitors because the measured characteristic is equal to the ratio of the capacitances, $C_1/C_2$, which cancels out any drift. The first embodiment of the 528 Patent measuring circuit, however, requires a square-wave generator. Square-wave voltage pulses are necessary because upon integration, they must yield triangular-wave voltage pulses that can be differentiated and have defined slopes. In addition, the square-wave generator must be stable. The triangular-wave voltage pulses and, thus, the square-wave voltage pulses must be reproducible over two successive signal periods, i.e., they must have the same amplitude and their mutually corresponding half-wave portions must have the same duration. Thus, for practical purposes, the square-wave voltage pulses generated by the square-wave generator 40 must have identical amplitudes and half-wave durations.

The second embodiment of the 528 Patent measuring circuit does not require the triangular-wave voltage pulses and, thus, the square-wave voltage pulses to have identical amplitudes or half-wave durations since $U_{s1}$, $U_{s2}$ and $U_{s3}$, $U_{s4}$ are determined during the same signal period. The second embodiment of the 528 Patent measuring circuit, however, still requires a square-wave generator Thus, both embodiments of the 528 Patent measuring circuit require a square-wave generator.

For the foregoing reasons, it is desirable to have a method and apparatus for measuring the change in capacitance values in dual capacitors that does not require a square-wave generator and is not susceptible to mutual drifts in the capacitors or drifts in the voltage source. The method and apparatus of the present invention meets this requirement.

SUMMARY OF THE INVENTION

The present invention is directed to a method and apparatus that satisfies the need for measuring the change in capacitance values in dual capacitors without requiring a square-wave generator and without being susceptible to mutual drifts in the capacitors or drifts in the voltage source. A circuit having the features of the present invention is connected to first and second capacitors respectively having first and second capacitance values $C_1$ and $C_2$. The first and second capacitors each have an independent electrode and share a common electrode. The circuit calculates a ratio R having $C_1$ in inverse relation to $C_2$.

The circuit is comprised of a means for generating an AC voltage $V_s$, a rectifying means, a converting means and a calculating means. $V_s$ is supplied to the common electrode of the first and second electrodes causing first and second AC current signals to be generated at the independent electrodes of the first and second capacitors. The rectifying means respectively converts the first and second AC current signals to first and second half-wave current signals. The converter means receives the first and second half-wave current signals and respectively converts them to first and second frequency signals respectively having frequency values $f_1$ and $f_2$. The calculating means uses $f_1$ and $f_2$ to calculate R.

DESCRIPTION OF THE DRAWINGS

The features, aspects, and advantages of the present invention will become better understood with regard to the following description, appended claims, and accompanying drawings where:

DESCRIPTION OF THE PREFERRED EMBODIMENT(S)

Figure 1:
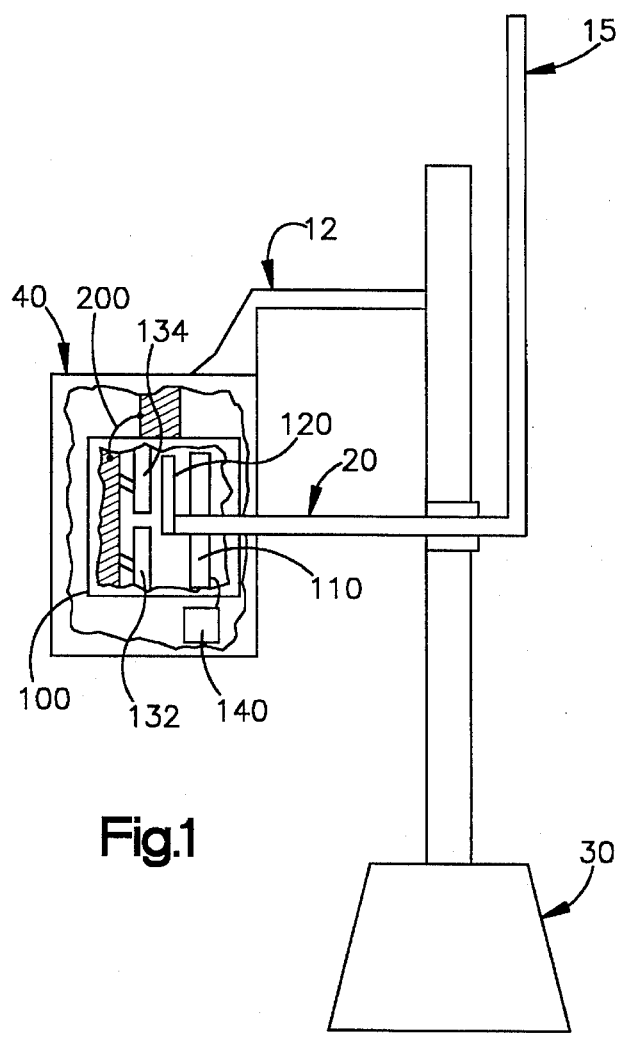
FIG. 1 shows a representative drawing of a displacement measuring apparatus containing a measuring circuit embodied in accordance with the present invention.

Referring now to FIG. 1 there is shown a representative drawing of a displacement measuring apparatus 5 containing a measuring circuit 200 embodied in accordance with the present invention. The displacement measuring apparatus 5 is comprised of a housing 40, a bracket 12, an armature 15, a rod 20, a base 30, the measuring circuit 200, an AC source 140 and a differential capacitor 100 having a half-plate rotor 120. The differential capacitor 100 is secured within the housing 40. The rod 20 is connected to the center of the half-plate rotor 120 and passes through an opening in the differential capacitor 100 and an opening in the housing 40. The bracket 12 is connected to the base 30 and the housing 40, thereby securing the differential capacitor 100 in a position which permits the rod 20 to pass through an opening in thee base 30 and connect with the armature 15. The rod 20 acts as an axle about which the half-plate rotor 120 rotates when a torque perpendicular to FIG. 1 is applied to the armature 15.

The differential capacitor 100 is comprised of the half-plate rotor 120, a common electrode 110, a first independent electrode 132 and a second independent electrode 134. The common electrode 110 is mounted parallel to the first and second independent electrodes 132 and 134. The common electrode 110 and first independent electrode 132 form a first capacitor and the common electrode 110 and the second independent electrode 134 form a second capacitor. The half-plate rotor 120 is rotatably mounted between the common electrode 110 and first and second independent electrodes 132 and 134.

The AC source 140 is electrically connected to the common electrode 110 and the half-plate rotor 120 is connected to circuit common. The first independent electrode 132 and second independent electrode 134 are connected to the capacitance measuring circuit 200. When a clockwise torque perpendicular to FIG. 1 is applied to the armature 15, the half-plate rotor 120 rotates clockwise, causing the surface area of the first electrode 132 adjacent to the common electrode 110 to increase, thereby increasing the capacitance of the first capacitor. The surface area of the second electrode 134 adjacent to the common electrode 110 decreases by the same amount, thereby decreasing the capacitance of the second capacitor by the same amount the capacitance of the first capacitor increases. The capacitances of the two capacitors change linearly with the change in angular displacement of armature 15 and the half-plate rotor 120.

The effect a change in capacitance has on a circuit can be determined from the following relationship, which is known per se:

$$I = \frac{V}{\sqrt{R^2 + (X_L - X_C)^2}}$$

where I is the effective current, V is the effective voltage, R is the resistance, $X_L$ is inductive reactance and $X_C$ is the capacitive reactance of the circuit. Since the value of $X_L$ and R in the differential capacitor 100 and measuring circuit 200 are negligible compared to $X_C$, the foregoing relationship can be reduced to:

$$I = \frac{V}{X_C}$$

Since it is also known per se that:

$$X_C = \frac{1}{2\pi f C}$$

the relationship further reduces to:

$$I = 2\pi f C V$$

Thus, a change in the capacitance, $C_1$, of the first capacitor causes a proportional change in the effective current of the AC current signal arising at the first independent electrode 132 and a change in the capacitance, $C_2$, of the second capacitor causes a proportional change in the effective current of the AC current signal arising at the second independent electrode 134. The measuring circuit 200 uses the changes in the effective currents to measure the angular displacement of the half-plate rotor 120 and, thus, the armature 15.

Figure 2:
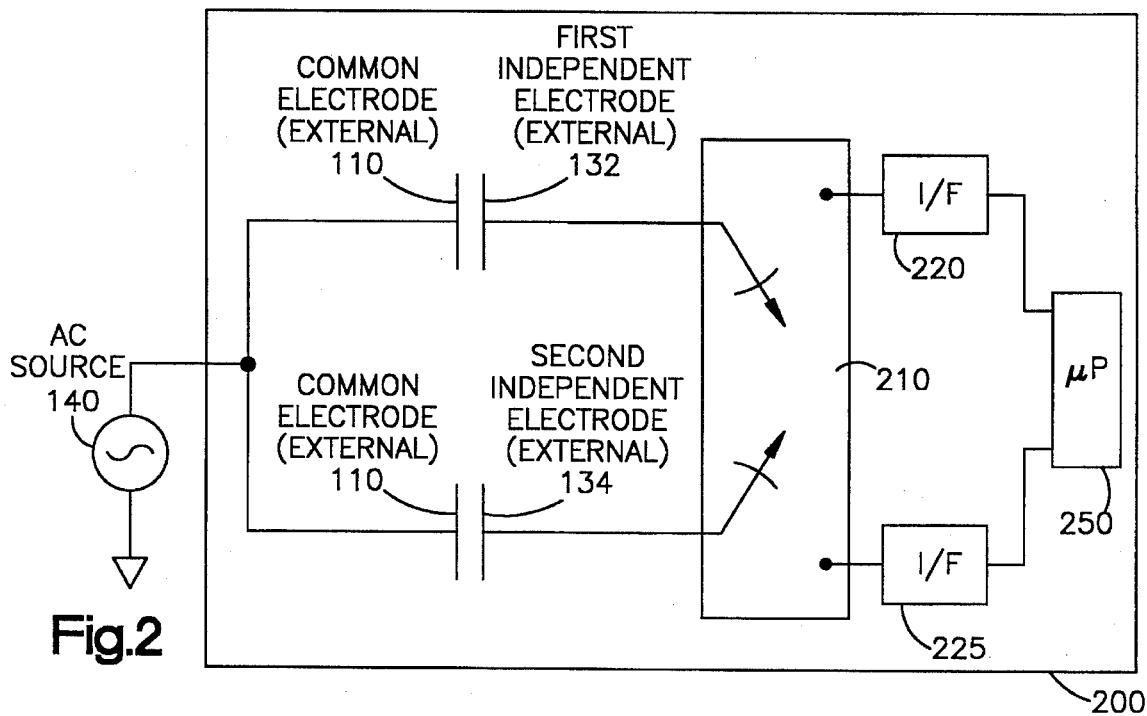
FIG. 2 shows a representative drawing of the measuring circuit embodied in accordance with the present invention.

Referring now to FIG. 2 there is shown a representative drawing of the measuring circuit 200 embodied in accordance with the present invention. The measuring circuit 200 is comprised of an analog switching means 210, a first current-to-frequency converter 220, a second current-to-frequency converter 225 and a microcontroller 250. The analog switching means 210 used in the current invention is a quadruple pole, double-throw switch. More specifically, the analog switching means 210 is a monolithic, charge-balanced, dual switched-capacitor instrumentation integrated circuit manufactured by Linear Technology Corporation and commercially available as part number LTC1043. An elementary schematic of the analog switching means 210 is shown in FIG. 3.

Figure 3:
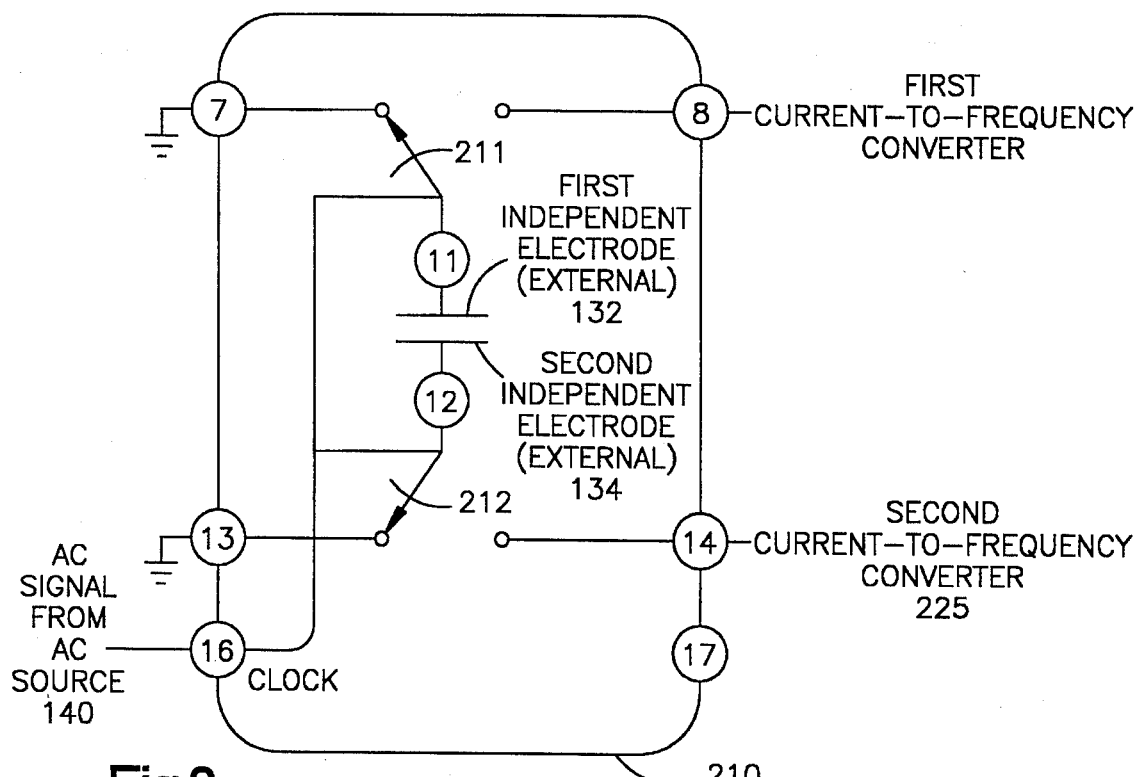
FIG. 3 shows an elementary schematic of an analog switching means used in the measuring circuit embodied in accordance with the present invention.

Referring now to FIG. 3, the AC signal from the AC source 140 is brought into Pin 16 of the analog switching means 210 and is used as an external clock, overriding the internal oscillator (not shown) of the analog switching means 210. The first independent electrode 132 and the second independent electrode 134 are respectively connected to one side of internal switches 211 and 212 at Pins 11 and 12. The other side of internal switches 211 and 212 are respectively connected through Pins 8 and 14 to the first current-to-frequency converter 220 and the second current-to-frequency converter 225. The opening and closing of the internal switches 211 and 212 is controlled by the frequency of the AC signal such that the internal switches 211 and 212 act as half-wave rectifiers. Thus, the AC current signals from the first independent electrode 132 and second independent electrode 134 respectively exit the analog switching means 210 from Pins 8 and 14 as first and second half-wave electrode signals.

The current, $I_1$, of the first half-wave electrode signal varies between 3 and 6 $\mu A_{avg}$ in proportion to changes in $C_1$. Similarly, the current, $I_2$, of the second half-wave electrode signal varies between 3 and 6 $\mu A_{avg}$ in proportion to changes in $C_2$. The first and second current-to-frequency converters (220, 225) respectively convert the first and second half-wave electrode signals to first and second electrode signals having varying frequencies. The first and second current-to-frequency converters (220, 225) of the present invention are ideally suited for converting small current signals such as $I_1$ and $I_2$ to frequency signals. With small currents, the first and second current-to-frequency converters (220, 225) retain their linearity and provide essentially infinite resolution.

Figure 4:
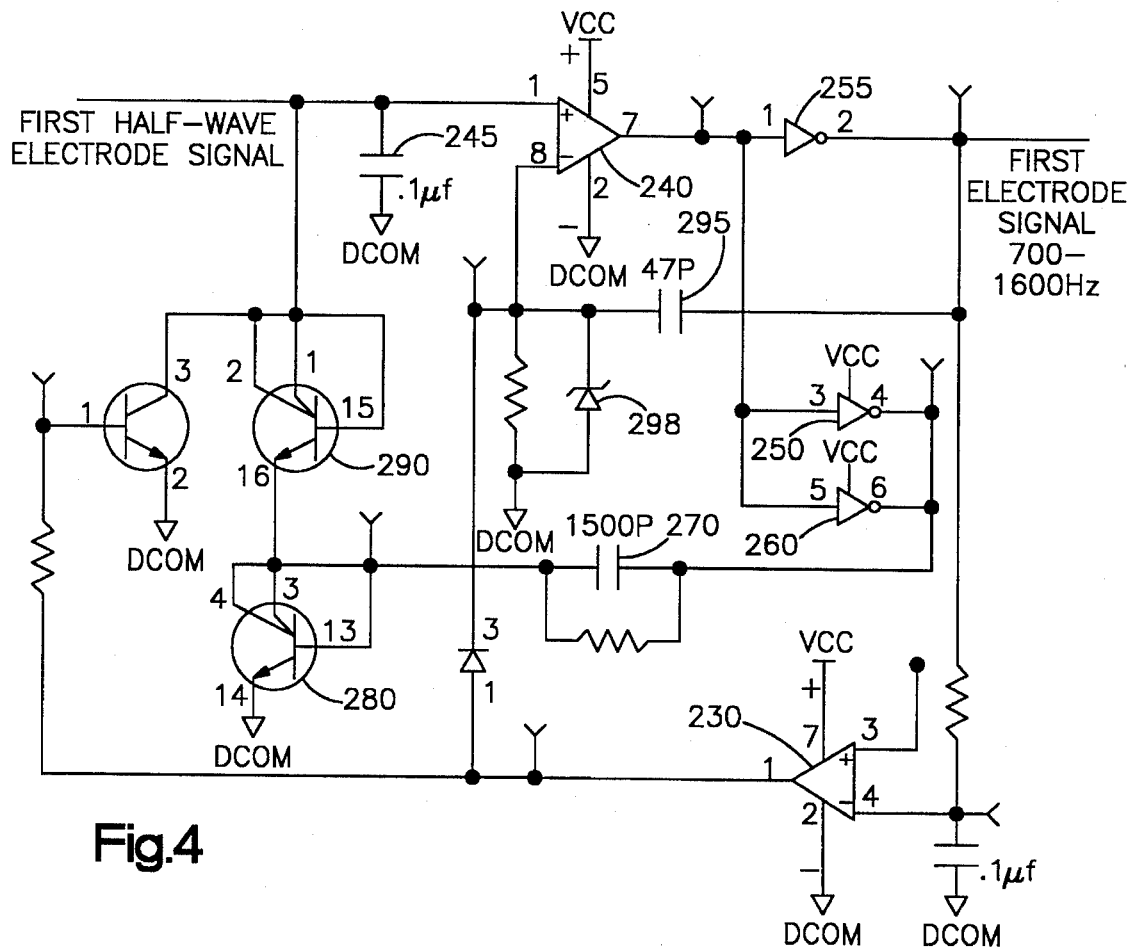
FIG. 4 shows an elementary schematic of a current-to-frequency converter used in the measuring circuit embodied in accordance with the present invention.

Referring now to FIG. 4 there is shown an elementary schematic of the first current-to-frequency converter 220. The first half-wave electrode signal is connected to a 0.1 μF capacitor 245 and the positive input of comparator 240. The 0.1 μF capacitor 245 filters the first half-wave electrode signal, creating a continuous positive going voltage ramp at the positive input to comparator 240. Assuming the positive input of comparator 240 to be below the negative input to comparator 240 (the output of comparator 230 is low), the output of comparator 240 will be low while the voltage at the positive input to comparator 240 is ramping. When the output of comparator 240 is low, the inverters (250, 260) will be switched high, permitting current to flow from the reference VCC through the supply pins of the inverters (250, 260) to a 1500 pF capacitor 270. The voltage to which the 1500 pF capacitor 270 charges is a function of the potential of VCC and the drop across transistor 280.

When the current ramp at the positive input of comparator 240 goes high enough, the output of comparator 240 goes high and the inverters (250, 260) switch low, causing current to discharge from the 1500 pF capacitor 270 through the inverters (250, 260) to ground. This, in turn, causes current to be pulled from the 0.1 μF capacitor 245 at the positive input of comparator 240 through transistor 290 to the 1500 pF capacitor 270. If the negative input to comparator 240 remained unchanged, the output of comparator 240 would almost immediately go low. However, when the output of comparator 240 goes high, inverter 255 also switches low, causing a 47 pF capacitor 295 to discharge and provide feedback to the negative input of comparator 240. The feedback drops the negative input of comparator 240, thereby delaying the output of comparator 240 from going low and permitting a complete discharge of the 1500 pF capacitor 270. The Schottky diode 298 prevents the negative input to comparator 240 to be driven outside its negative common-mode limit. When the feedback from the 47 pF capacitor 295 decays, comparator 240 switches low and the entire cycle repeats. The period of the cycle depends directly on the current of the first half-wave electrode signal. Thus, the frequency, $f_1$, of the first electrode signal output by the first current-to-frequency converter 220 varies proportionally with changes in the current $I_1$ of the first half-wave electrode signal.

The second current-to-frequency converter 225 is identical in structure and function to the first current-to-frequency converter 220. Accordingly, a schematic of the second current-to-frequency converter 225 is not included. The second current-to-frequency converter 225 operates to generate the second electrode signal which has a frequency, $f_2$, that varies proportionally with changes in the current $I_2$ of the second half-wave electrode signal.

Referring back to FIG. 2, the first and second electrode signals from the first and second current-to-frequency converters (220, 225) are ideally suited for input into the microcontroller 250 since they are frequency signals with a range of 800 to 1600 Hz. The microcontroller 250 is a Motorola MC68H 8-bit microcontroller having a 16-bit free running counter (not shown) that is clocked by the output of a four-stage prescaler (not shown) driven by an MCU E clock (not shown). The first and second electrode signals are received by first and second input channels (not shown) in the microcontroller 250. The first and second input channels are respectively monitored by first and second input capture edge detectors (not shown). The first and second input capture edge detectors respectively sense falling edges in the first and second electrode signals.

When the first input capture edge detector detects the first falling edge in the first electrode signal during a sample period, a beginning value of the counter is held in a first input capture register. When the first input capture edge detector detects the last falling edge in the first electrode signal during the sample period, an ending value of the counter is held in the first input capture register. The beginning counter value is subtracted from the ending counter value and the difference is divided by the number of falling edges detected during the sample period to yield the frequency value, $f_1$.

Similarly, when the second input capture edge detector detects the first falling edge in the second electrode signal during a sample period, a beginning value of the counter is held in a second input capture register. When the second input capture edge detector detects the last falling edge in the second electrode signal during the sample period, an ending value of the counter is held in the second input capture register. The beginning counter value is subtracted from the ending counter value and the difference is divided by the number of falling edges detected during the sample period to yield the frequency value, $f_2$. It should be appreciated that the same values for $f_1$ and $f_2$ would be obtained by having the input capture edge detectors encoded to sense rising edges in the first and second electrode signals instead of falling edges.

A program in the read only memory (ROM) portion (not shown) of the microprocessor 250 accesses the first and second input capture registers, thereby obtaining the frequency values, $f_1$ and $f_2$, of the first and second electrode signals. Using $f_1$ and $f_2$, the ROM program calculates a ratio, R, equal to:

$$\frac{C_1 - C_2}{C_1 + C_2}$$

pursuant to the relationship:

$$R = \frac{C_1 - C_2}{C_1 + C_2} = R_f = \frac{f_1 - f_2}{f_1 + f_2}.$$

R is equal to $R_f$ because $C_1$ and $C_2$ are directly proportional to $f_1$ and $f_2$ respectively and the constant parameters for $f_1$ and $f_2$ cancel out in the ratio. The ROM program uses R to calculate the angular displacement, A, of the half-plate rotor 120 and, thus, the armature 15. It should be appreciated that other ratios could be used wherein $f_1$ and $f_2$ are in inverse relation to each other, i.e., ratios where $f_1$ is in the numerator and $f_2$ is in the denominator or $f_2$ is in the numerator and $f_1$ is in the denominator.

During an initial calibration procedure, the armature 15 (shown in FIG. 1) is moved to its two extreme positions, i.e., 0° displacement and 90° displacement. The ROM program calculates R at 0° and 90° displacement, respectively yielding calibration frequency ratio values $R_0$ and $R_{90}$. The values $R_0$ and $R_{90}$ are stored in the electrically erasable programmable read-only memory (EEPROM) portion (not shown) of the microcontroller 250 for use during the normal operation of the measuring circuit 200.

Since the capacitances of the two capacitors change linearly with the change in angular displacement, A, of the half-plate rotor 120 (shown in FIG. 1), the currents of the AC current signals arising at the first and second independent electrodes (132, 134) (shown in FIG. 1), and the half-wave electrode signals generated therefrom, change linearly. Accordingly, $f_1$ and $f_2$, and therefore, R, change linearly with A. Thus, during the normal operation of the measuring circuit 200, the ROM program calculates A pursuant to the linear relationship:

$$A = (R - R_0) \cdot \frac{90}{R_{90} - R_0}.$$

Since the measuring circuit 200 calculates A using R, which is a ratio, the constant parameters for $f_1$ and $f_2$ cancel out and, thus, do not appear in the linear relationship used to calculate A. In addition, any mutual drifts occurring in the first and second capacitors arising from the environment and any drifts in the frequency or amplitude of the AC source 140 are canceled out. Thus, the measuring circuit 200 measures the change in capacitance values $C_1$ and $C_2$ in the differential capacitor 100 without being susceptible to mutual drifts in the first and second capacitors or drifts in the AC source 140. The measuring circuit 200 accomplishes the foregoing while consuming less than 5 milliwatts of power. Such low power consumption eases intrinsic safety concerns.

It should be appreciated that the measuring circuit of the present invention is equally well suited for use with dual capacitors wherein one capacitor is fixed and one capacitor is variable. The change in capacitance (and corresponding frequency value) of the variable capacitor will provide the necessary measure of displacement while any fluctuation in the capacitance (and corresponding frequency value) of the fixed capacitor caused by mutual drifts in the capacitors or drifts in the AC source will provide the necessary cancellation of the corresponding fluctuation in the capacitance (and corresponding frequency value) of the variable capacitor.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A circuit connected to first and second capacitors respectively having first and second capacitance values $C_1$ and $C_2$, said first and second capacitors each having an independent electrode and sharing one common electrode, said circuit calculating a ratio, R, having $C_1$ in inverse relation to $C_2$, said circuit comprising:

a) means for generating an AC voltage, $V_s$, and supplying $V_s$ to said common electrode of said first and second capacitors to respectively produce first and second AC current signals at said independent electrodes of said first and second capacitors;

b) rectifying means connected to said independent electrodes for respectively converting said first and second AC current signals to first and second half-wave current signals;

c) means connected to said rectifying means for respectively converting said first and second half-wave current signals to first and second frequency signals respectively having frequency values $f_1$ and $f_2$; and (d) means for calculating R from $f_1$ and $f_2$.

2. The circuit of claim 1 wherein R is equal to:

$$\frac{C_1 - C_2}{C_1 + C_2}$$

and wherein said means for calculating R calculates R in accordance with:

$$R = \frac{f_1 - f_2}{f_1 + f_2}.$$

3. The circuit of claim 1 wherein R is equal to:

$$\frac{C_1}{C_2}$$

and wherein said means for calculating R calculates R in accordance with:

$$R = \frac{f_1}{f_2}.$$

4. The circuit of claim 1 wherein R is equal to:

$$\frac{C_1}{C_1 + C_2}$$

and wherein said means for calculating R calculates R in accordance with:

$$R = \frac{f_1}{f_1 + f_2}.$$

5. The circuit of claim 1 wherein said first and second capacitors are dual inversely variable capacitors.

6. The circuit of claim 5 wherein said dual inversely variable capacitors are a differential capacitor.

7. The circuit of claim 1 wherein said rectifying means is comprised of a dual switched-capacitor integrated circuit.

8. The circuit of claim 7 wherein said converting means is comprised of two current-to-frequency converters.

9. The circuit of claim 1 wherein said first capacitor is variable and said second capacitor is fixed.

10. An apparatus for measuring a displacement, D, of a first object relative to a second object, D being within a range having a maximum $D_{max}$ and a minimum $D_{min}$, said apparatus comprising:

(a) first and second capacitors respectively having capacitance values $C_1$ and $C_2$ connected to said first and second objects, said first and second capacitors each having an independent electrode and sharing one common electrode, said first and second capacitors being arranged such that the displacement of said first object causes a proportional change in $C_1$;

(b) means for generating an AC voltage $V_s$ and supplying $V_s$ to said common electrode of said first and second capacitors to respectively produce first and second AC current signals at said independent electrodes of said first and second capacitors;

(c) rectifying means connected to said independent electrodes for respectively converting said first and second AC current signals to first and second half-wave current signals;

(d) means connected to said rectifying means for respectively converting said first and second half-wave current signals to first and second frequency signals respectively having frequency values $f_1$ and $f_2$;

(e) means for calculating from $f_1$ and $f_2$ a ratio, R, having $C_1$ in inverse relation to $C_2$;

(f) means for storing the value of R, $R_{min}$, when the displacement of said first body is at $D_{min}$ and for storing the value of R, $R_{max}$, when the displacement of said first body is at $D_{max}$; and (g) means for calculating D in accordance with $$D = (R - R_{min}) \cdot \frac{D_{max} - D_{min}}{R_{max} - R_{min}}.$$

11. The apparatus of claim 10 wherein R is equal to:

$$\frac{C_1 - C_2}{C_1 + C_2}$$

and wherein said means for calculating R calculates R in accordance with:

$$R = \frac{f_1 - f_2}{f_1 + f_2}.$$

12. The apparatus of claim 10 wherein said first and second capacitors are dual inversely variable capacitors arranged such that the displacement of said first object also causes a negative proportional change in $C_2$.

13. A method for calculating a ratio, R, having a capacitance value, $C_1$, in inverse relation to a capacitance value, $C_2$, where $C_1$ and $C_2$ are the capacitance values of a first and second capacitor respectively, said first and second capacitors each having an independent electrode and sharing one common electrode, said method comprising the steps of:

a) generating an AC voltage, $V_s$, and supplying $V_s$ to said common electrode of said first and second capacitors to respectively produce first and second AC current signals at said independent electrodes of said first and second capacitors;

b) converting said first AC current signal to a first half-wave current signal;

c) converting said second AC current signal to a second half-wave current signal;

d) converting said first half-wave current signal to a first frequency signal having a frequency value $f_1$;

e) converting said second half-wave current signal to a second frequency signal having a frequency value $f_2$; and (f) calculating R from $f_1$ and $f_2$.

14. The circuit of claim 13 wherein R is equal to:

$$\frac{C_1 - C_2}{C_1 + C_2}$$

and wherein said means for calculating R calculates R in accordance with:

$$R = \frac{f_1 - f_2}{f_1 + f_2}.$$

* * * * *